(12) United States Patent
Hollingsworth

(10) Patent No.: US 7,145,552 B2
(45) Date of Patent: Dec. 5, 2006

(54) ELECTRIC FIELD PROXIMITY KEYBOARDS AND DETECTION SYSTEMS

(75) Inventor: Tommy D. Hollingsworth, Leander, TX (US)

(73) Assignee: Solectron Corporation, Milpitas, CA (US)

(*) Notice: Subject to any disclaimer, the term of this patent is extended or adjusted under 35 U.S.C. 154(b) by 420 days.

(21) Appl. No.: 10/691,099

(22) Filed: Oct. 22, 2003

(65) Prior Publication Data

US 2005/0088416 A1   Apr. 28, 2005

(51) Int. Cl.
*G09G 5/00* (2006.01)

(52) U.S. Cl. .................. 345/168; 345/173; 345/179; 341/22

(58) Field of Classification Search ................ 345/168, 345/156, 173, 179; 341/22–23; 178/18.01, 178/18.03
See application file for complete search history.

(56) References Cited

U.S. PATENT DOCUMENTS

| | | | |
|---|---|---|---|
| 3,971,013 | A | 7/1976 | Challoner et al. |
| 4,369,432 | A * | 1/1983 | Mikami ..................... 341/120 |
| 4,394,643 | A | 7/1983 | Williams |
| 4,680,430 | A * | 7/1987 | Yoshikawa et al. ......... 345/174 |
| 5,260,521 | A | 11/1993 | Knowles |
| 5,324,895 | A | 6/1994 | Inamori et al. |
| 5,572,205 | A | 11/1996 | Caldwell et al. |
| 5,586,042 | A | 12/1996 | Pisau et al. |
| 5,594,222 | A | 1/1997 | Caldwell |
| 5,673,041 | A | 9/1997 | Chatigny et al. |
| 6,452,514 | B1 | 9/2002 | Philipp |
| 6,861,961 | B1 * | 3/2005 | Sandbach et al. ............. 341/22 |
| 2002/0130848 | A1 | 9/2002 | Sims |

OTHER PUBLICATIONS

Jim Midolo, The Advent of Programmable Electronic Keyboards, ECN, Dec. 2001, p. 13, EAO Switch Corp, US.
Touch Sensitive, Touch Sensitive Technology Overview, pp. 15-16, Jun. 2002, EAO, US.

* cited by examiner

*Primary Examiner*—Richard Hjerpe
*Assistant Examiner*—Kimnhung Nguyen
(74) *Attorney, Agent, or Firm*—Robert Moll

(57) ABSTRACT

The invention is related to an electric field proximity detection system suitable for use as a touch sensitive keyboard or to be used in close proximity without direct contact. In an embodiment of a circuit useful in the system, an AC signal is coupled to a single electrode functioning as an antenna radiating an electric field through a high impedance circuit. A conductive object in close proximity disturbs the field causing a voltage change across nodes of the high impedance circuit that is compared by a detector circuit that generates a DC output indicating an object is close to the electrode. In another embodiment, the circuit couples to an analog multiplexer to control a plurality of electrodes. In another embodiment, a row and column address scheme couples a plurality of electrodes and increases resolution without substantially increasing complexity. The circuits may be integrated in a semiconductor to reduce size and cost. The electric field proximity detection system extends to applications related to object detection such as remote sensing, motion detection and remote controls.

19 Claims, 7 Drawing Sheets

ELECTRIC FIELD PROXIMITY KEYBOARDS AND DETECTION SYSTEMS

BACKGROUND

This invention relates to electric field proximity detection systems and particularly to electric field proximity circuits for touch sensitive or close proximity keyboards.

Many keyboards today are activated by depressing a keypad. A touch sensitive keyboard provides a similar I/O device, but is activated by merely touching rather than depressing each keypad. Touch sensitive keyboards are used in a variety of applications such as handheld computing devices (e.g., PDA), musical instruments, elevator switches, appliances, bank ATMs, and computers. Other types of touch sensitive keyboards can be activated by an object such as a finger or stylus touching the keypads displayed on a computer or terminal. A close proximity keyboard does not require contact, but is activated when an object (e.g., stylus or finger) is detected in close proximity to the keypad. Close proximity means the object is at a distance that should be detected for activation. The close proximity keyboard is especially useful where physical contact would result in undue wear or contamination in a sterile or hazardous environment.

In the past, touch sensitive and close proximity keyboards have used complicated detection systems. Some of these detection systems are described in U.S. Pat. Nos. 6,452,514 B1, 5,572,205, and 5,594,222, and U.S. published patent application Ser. No. 2002/0130848 A1. These patents and application describe use of two spaced apart electrodes or conductive pads such as a transmit electrode and a receiver electrode with a keypad. An object is detected as close to the keypad when it interferes with a signal coupled or transmitted between the two electrodes or pads. U.S. Pat. No. 3,971,013 takes a different approach using a gas panel to detect gas discharge due to contact to the gas panel. Due to the complexity of these detection designs, the costs impact the adoption rates of these types of keyboards.

SUMMARY OF THE INVENTION

The present invention relates to several embodiments of electric field proximity detection systems. The systems are suitable for touch sensitive keyboards and/or close proximity keyboards. In one embodiment, each keypad uses an electrode to radiate an electric field. In others, each keypad has a plurality of electrodes. The electric field is disturbed by touching an associated area (e.g., a keypad) or by a conductive object in close proximity to that area. A circuit that can sense when the electric field is disturbed and sends an output to activate a response and/or to a controller for further analysis and in some cases activation of a response.

In other features, the electric field proximity detection systems use row and column address schemes to multiplex the electrodes. The row and columns can be nested to permit higher resolution. The address schemes generally reduce complexity, and costs by reducing the addresses. The electric field proximity circuits, arrangements of electrodes, and address schemes are not limited to the keyboards and extend to applications related to object detection such as remote sensing, motion detection and remote control. By increasing the resolution using the row and column schemes, the waveform characteristics change accordingly. The controller can store the different loaded state waveforms characteristics for various objects for analysis and identification of the object types, and distance and duration of the object.

DETAILED DESCRIPTION OF THE PREFERRED EMBODIMENTS

Figure 1:
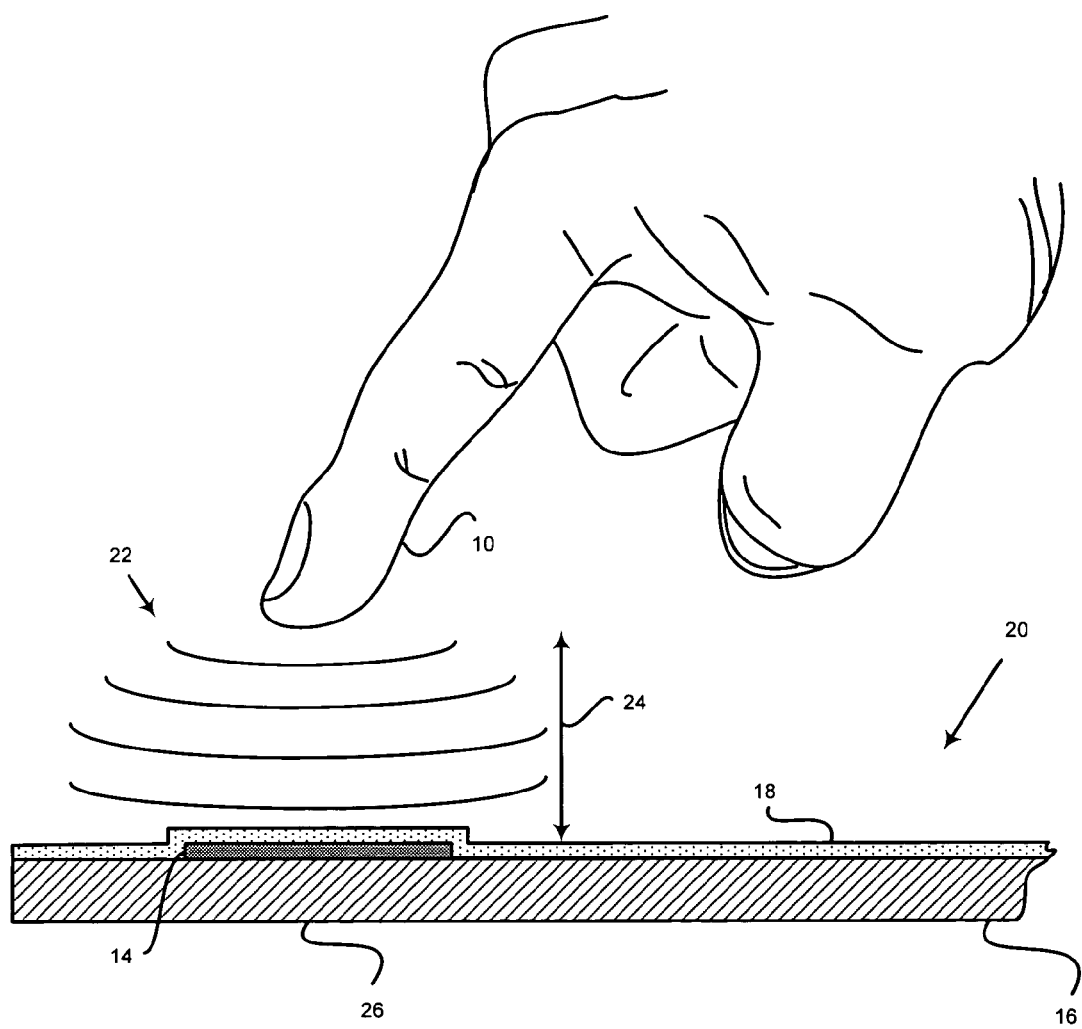
FIG. 1 illustrates an object in close proximity to an electrode associated with a keypad of an electric field proximity keyboard.

The following description includes the best mode of carrying out the invention. The detailed description is made for the purpose of illustrating the general principles of the invention and should not be taken in a limiting sense. The scope of the invention is determined by reference to the claims.

We assign each part, even if structurally identical to another part, a unique reference number wherever that part is shown in the drawing figures. A dashed circle indicates a portion of a figure that is enlarged in another figure. The figure showing the enlarged portion is indicated by a reference number tied to the dashed circle.

FIG. 1 illustrates an electric field proximity keyboard 20 that includes a substrate 16 such as a printed circuit board (PCB) and one or more keypads each with an electrode 14. Each electrode can be made, for example, by conductive patterns on the PCB and is connected to an AC signal source described further in connection with FIG. 2. The electrode 14 functions as an antenna radiating an electric field 22 and is located over a non-metallized portion 26 of the substrate 16 to reduce loading of the electric field 22. A conductive object such as a finger 10 in close proximity to the electrode 14, for example, at a distance 24, will disturb, i.e., reduce the intensity of electric field 22. This is referred to as electric field attenuation or loading. The electrode 14 may be protected from the environment and physical contact by a low loss dielectric layer 18 such as a solder mask or another other dielectric media (not shown) over the layer 18. Suitable materials include a polycarbonate cover, glass, plastic, wood and other non-conductive materials that do not overly attenuate the electric field 22.

Figure 2:
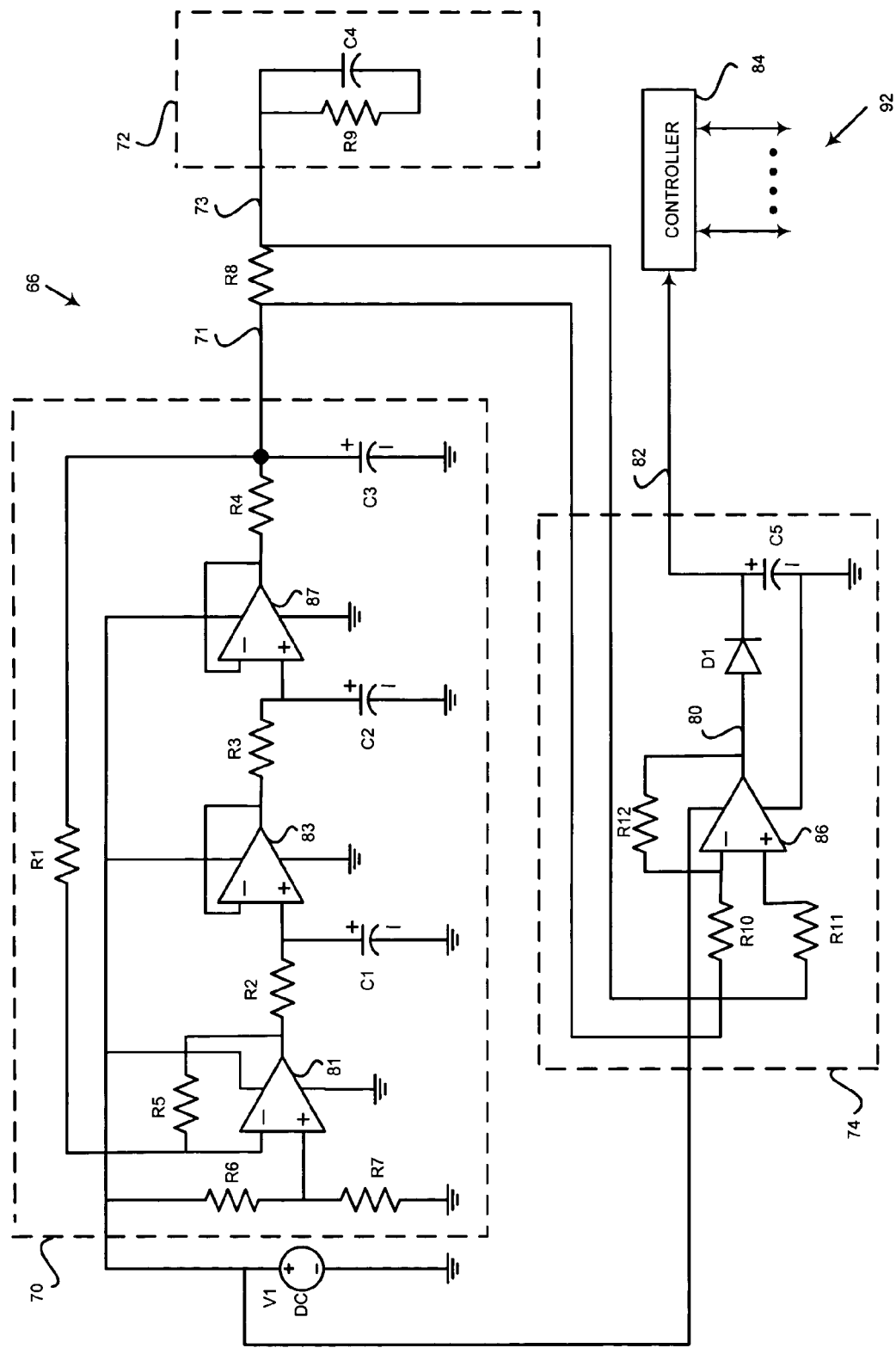
FIG. 2 illustrates a circuit for an electrode suitable for use in an electric field proximity keyboard.

FIG. 2 illustrates a circuit 66 for a single electrode of an electric field proximity keyboard. Horowitz and Hill, *The Art of Electronics* (Second Edition, 1989) describe electronic circuit design and is incorporated by reference herein. This circuit 66 can be used for an electrode in a keyboard or another electric field proximity detection system although other arrangements are possible as will be described below. It should be also understood that any circuit lines that cross each other are not electrically connected unless the intersection is covered by a solid dot. The circuit 66 includes an electrode circuit 72 (i.e., modeling the electrode 14), an oscillator circuit 70 that includes multi-stage feedback oscillator amplifiers 81, 83, and 87, and RC low pass filters such as the following resistor and capacitors: R2-C1, R3-C2, and R4-C3. The oscillator circuit 70 produces an AC signal, for example, a 64 KHz signal, at a first node 71. A high impedance circuit such as a resistor R8 (e.g., 2k ohms to 100 M ohms) isolates the AC signal from the electrode circuit 72 illustrated as a variable impedance parallel RC circuit with a resistor R9 and a capacitor C4.

The detector circuit will detect the loading of the electrode when an object such as a human finger 10 is in close proximity or in contact with the electrode by comparing the voltage difference of the AC signal source with the electric field voltage at the electrode 14. More specifically, when there is no conductive object near the electrode 14, the electrode circuit 72 is in an unloaded state. In this state, resistor R9 has a high resistance of 1 M ohm or more and capacitor C4 has a low capacitance such as 1–10 picofarads and the voltage at a second node 73 is substantially identical to the voltage at the first node 71. Thus, resistor R9 and capacitor C4 represent the impedance of the body (specifically the finger 10) as it approaches the electrode 14.

When a conductive object is close to electrode 14, the electrode circuit 72 is loaded and grounded and the resistor R9 goes as low as 1k ohm, while the capacitance of capacitor C4 increases to 100 picofarads or more and the voltage at second node 73 is attenuated in an amount dependent on the distance 24 of the conductive object such as a finger 10 to the electrode 14 in FIG. 1. Voltage waveforms for unloaded and loaded states is discussed in connection with FIGS. 7A and 7B.

The detector circuit 74 indicates when an object is close to the electrode. When a conductive object is close to electrode 14 (FIG. 1) modeled by electrode circuit 72, the detector circuit 74 senses a voltage drop at second node 73 with respect to the reference voltage at first node 71. A differential operational amplifier 86 uses the voltage at first node 71 as its inverting input and the voltage at second node 73 as its noninverting input. In an alternative, the second node 73 can be the inverting input and the first node 71 the noninverting input. The output 80 is coupled to a diode $D_1$ for conversion to a DC output 82 indicating an object is in close proximity. A sample hold capacitor $C_5$ connected to diode $D_1$ reduces noise in DC output 82. The closer the object to the electrode 14, the larger electric field attenuation as indicated by a drop in the DC output 82. The DC output 82 is coupled to a controller 84 with addresses 92. One suitable programmable integrated circuit for the controller 84 is the Microchip PIC16F77 made by Microchip Technology, Inc. in San Jose, Calif., which performs logic to analyze DC output 82 as described below.

Figure 3:
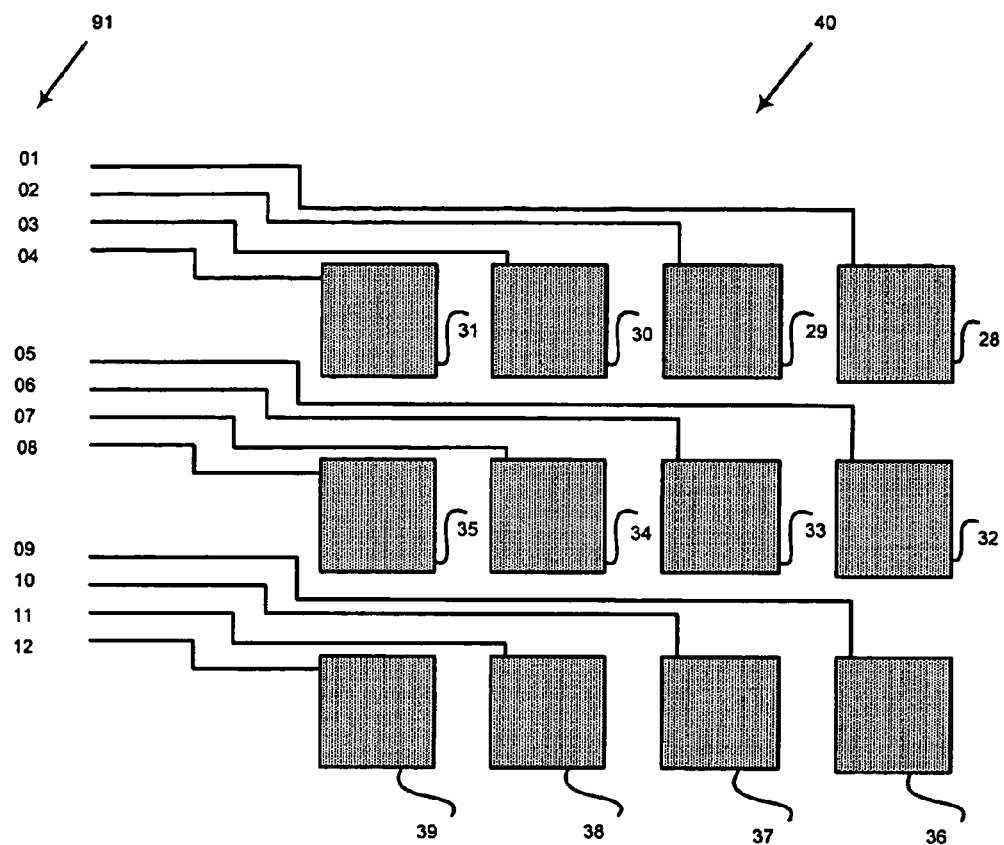
FIG. 3 illustrates an electric field proximity keyboard with an address to each electrode.

FIG. 3 illustrates an electric field proximity keyboard 40 having twelve keypads associated with twelve electrodes 28, 29, 30, 31, 32, 33, 34, 35, 36, 37, 38 and 39 that connect to corresponding I/O addresses 01, 02, 03, 04, 05, 06, 07, 08, 09, 10, 11, and 12 that are inputs to an analog multiplexer 90 discussed in connection with FIG. 6.

Figure 4:
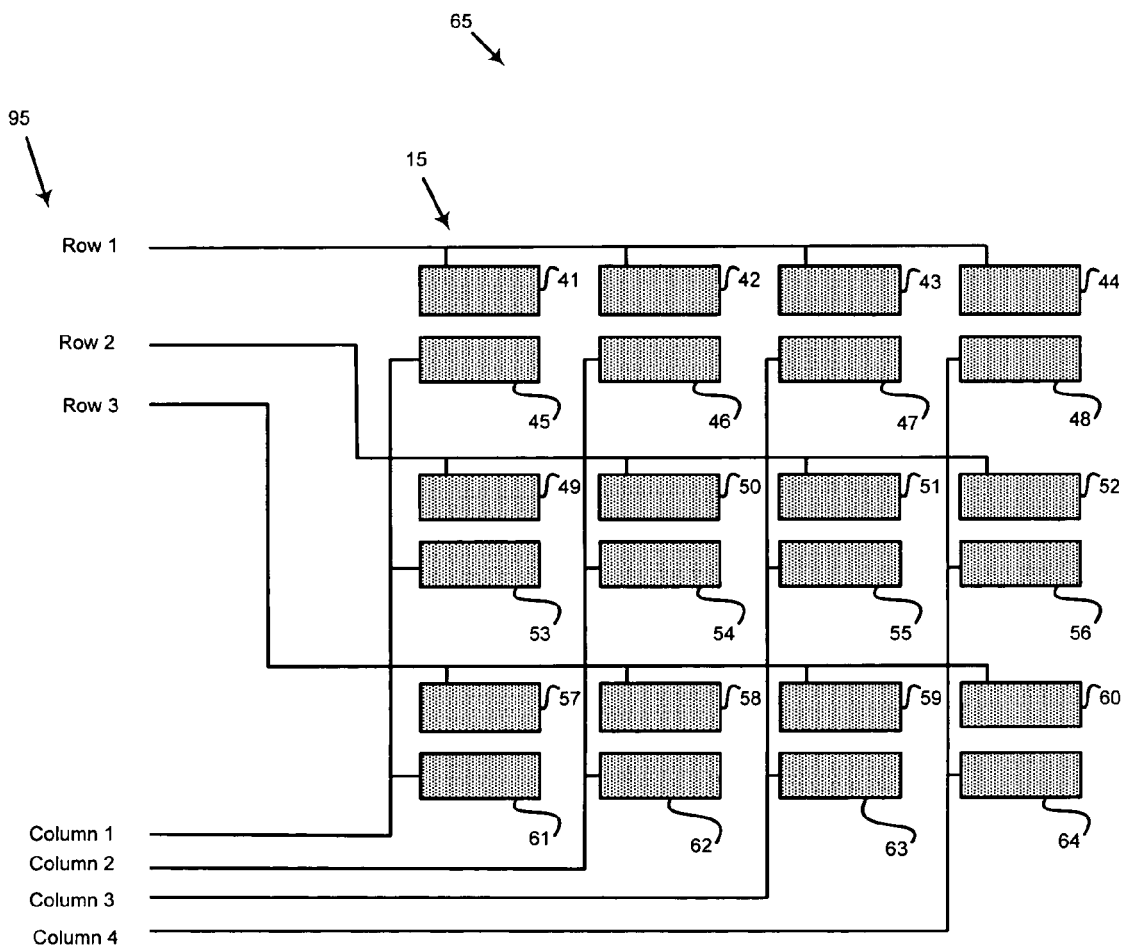
FIG. 4 illustrates a row and column address scheme for an electric field proximity keyboard.

FIG. 4 illustrates a row and column address scheme for an electric field proximity keyboard 65. The AC signal described earlier can be multiplexed to a pair of electrodes associated with each keypad using the address scheme. Each electrode of the pair radiates its own electric field. Thus, if one electrode fails, the other electrode can still independently radiate and sense disturbance of its own electric field. For example, keypad 15 has an electrode 41 connected to an address represented by row 1 and an electrode 45 connected to an address represented by column 1. The product of the rows and columns (m×n) will equal the total number of keypads, while the sum of the rows and columns (m+n) will equal the number of addresses. FIG. 4 illustrates the scheme with 12 keypads made up of three rows and four columns and seven addresses. As shown, the AC signal is coupled to the electrodes 41, 42, 43, and 44 on row 1, to the electrodes 49, 50, 51, and 52 on row 2, and to the electrodes 57, 58, 59, and 60 on row 3. The AC signal is coupled to electrodes 45, 53 and 61 on column 1, to electrodes 46, 54 and 62 on column 2, to electrodes 47, 55 and 63 on column 3, and to electrodes 48, 56, and 64 on column 4. An individual keypad 15 can be viewed as a 1×1 electrode pair of row electrode 41 and column electrode 45. In contrast to the keyboard 40 shown in FIG. 3, where the number of I/O addresses equal the number of keypads, this addressing scheme scales increasingly well as the number of keypads increases. For example, I/O addresses made up nine rows and 16 columns will form an array of (9×16) 144 electrode pairs with only (9+16) 25 I/O addresses. This reduces the complexity of the addressing scheme, manufacturing costs and has advantages as discussed in connection with FIG. 6.

Figure 5:
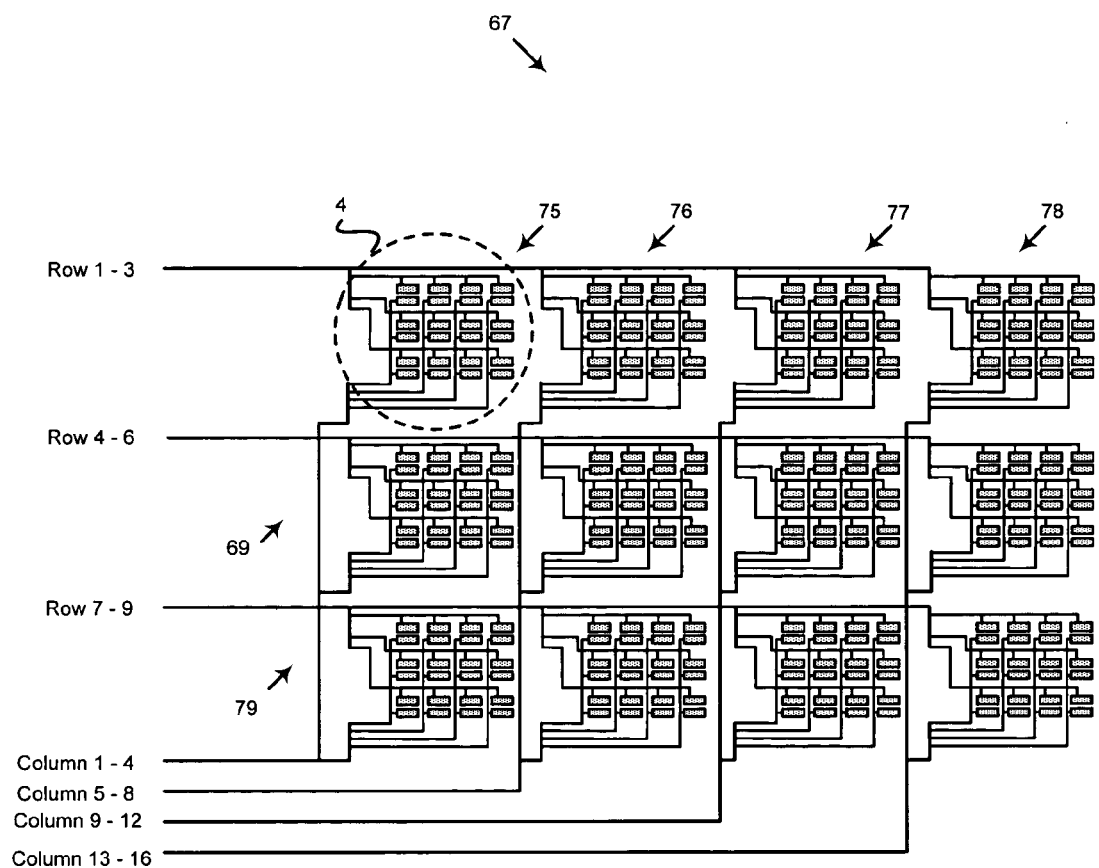
FIG. 5 illustrates a nesting row and column address scheme for an electric field proximity keyboard.

In another embodiment shown in FIG. 5, the address scheme can be used on a keypad such as keypad 75 on an electric field proximity keyboard 67 by nesting the row and column addresses to form a larger array of electrodes. For example, the electric field keyboard 67 is defined by an array of keypads with three rows ($m_1=3$) and four columns ($n_1=4$) such as the keypads 75, 76, 77, and 78, where each of the keypads such as keypad 75 is further defined by an array with three rows ($m_2=3$) and four columns ($n_2=4$) of electrode pairs. The electric field proximity keyboard 67 includes a total of 12 ($m_1 \times n_1$) keypads and a total of ($m_2 \times n_2$) 12 electrode pairs associated with each keypad such as keypad 75. Thus, the address scheme has a total of 144 ($m_1 \times n_1) \times (m_2 \times n_2$) electrode pairs but only 25 ($m_1 \times m_2)+(n_1 \times n_2$) I/O addresses.

Still referring to FIG. 5, the first row of keypads such as keypads 75, 76, 77, and 78 are activated by their associated electrodes coupled to address rows 1, 2, and 3. The second and third rows of keypads are activated by their associated electrodes coupled to address rows 4, 5, and 6, and 7, 8, and 9, respectively. The first column of keypads 75, 69, and 79 are activated by their associated electrodes coupled to column addresses 1, 2, 3, and 4. Likewise, the second, third and fourth column of keypads are activated by their associated electrodes coupled to column addresses 5, 6, 7, and 8, column addresses 9, 10, 11, and 12, and column addresses 13, 14, 15, and 16, respectively. The increase in electrodes per keypad increases resolution of the detected object and keeps the design simple. FIG. 4 shows an enlarged view of an electrode array for a single keypad 75.

By increasing the number of electrodes associated with each keypad, a larger number of smaller and overlapping electric fields can be generated and sensed so that together the electrodes for a given area (e.g., keypad) act like a phased array antenna or a multi-aperture antenna to closely resolve the approaching object. The resulting signals sent to the microcontroller can be analyzed as to the shape and conductivity of the object in close proximity to the keypad to validate or invalidate the object as activating the keypad. The shape and pattern of electrodes to be used include common planar antenna structures that can be printed onto the PCB such as rectangular, circular, spiral, looped, serpentine and inter-digital structures.

Figure 6:
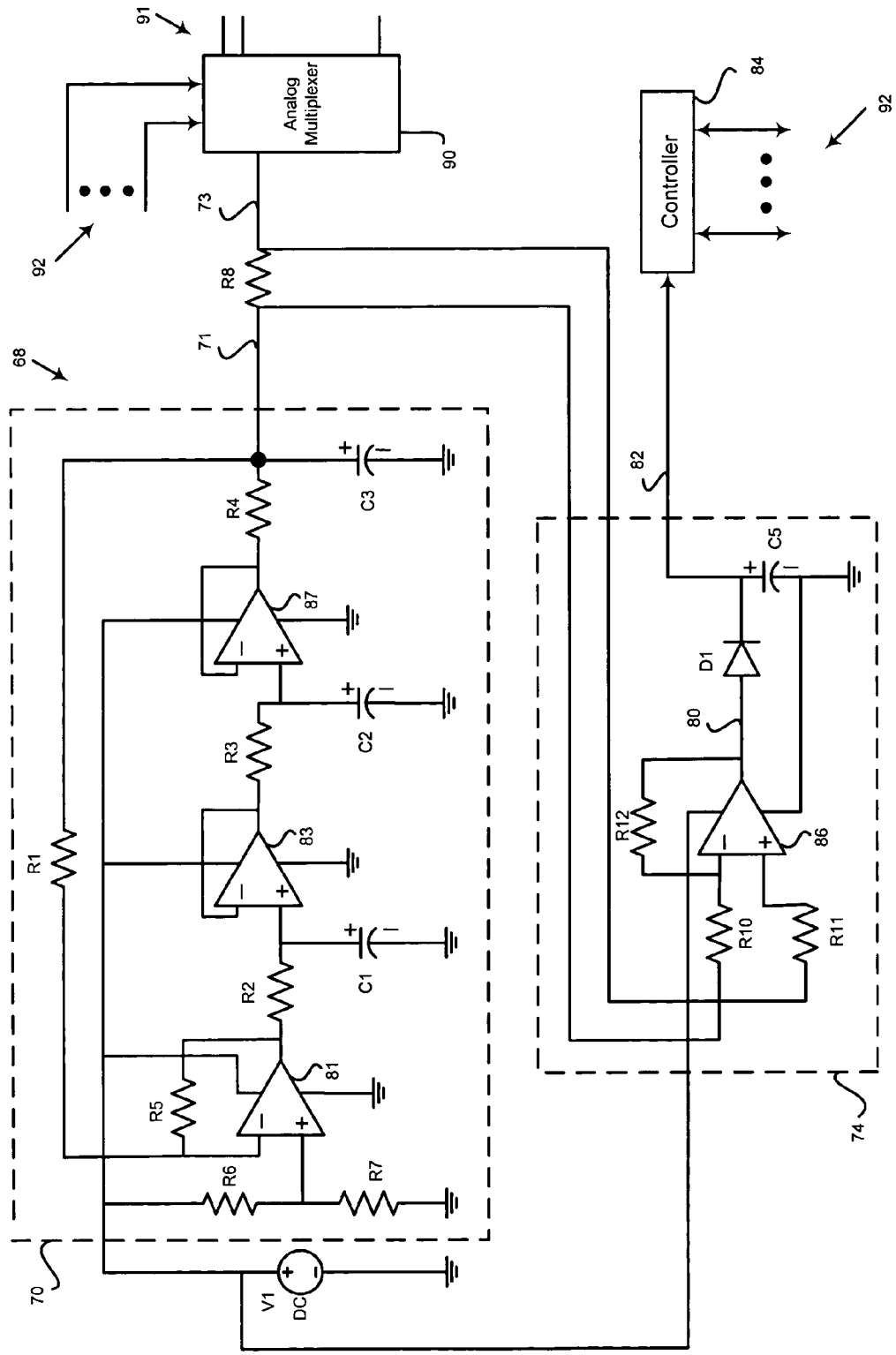
FIG. 6 illustrates a circuit for a plurality of electrodes suitable for use in an electric field proximity keyboard.

FIG. 6 illustrates a circuit 68 for an electric field proximity keyboard with an AC signal source coupled through a high impedance circuit such as resistor R8 at the second node 73 to the output of the analog multiplexer 90 such as the 64-channel 491AMUX1-64 multiplexer manufactured by Quad Tron, Inc. in Feasterville, Pa. Horowitz and Hill, *The Art of Electronics* (Second Edition, 1989) describe analog multiplexers and is incorporated by reference herein. The plurality of analog multiplexer inputs are the I/O addresses to the electrodes. A plurality of multiplexers can be also connected in parallel to increase I/O addresses, that is, the channel capacity. The AC signal is selected and connected to each of the plurality of I/O addresses 91 that are the inputs of the analog multiplexer for a predetermined time and a control command 92 of the controller 84 selects the I/O address to connect. The controller 84 switches the AC signal to each of the I/O addresses 91 that interface with the electrodes associated with the keypads. The controller 84 is programmed as is known in this field to compensate for background noise, to determine the distance and time duration the object must be from the electrode to be in close proximity, and to compare the object to known signatures (e.g., shapes and conductivity). The functions on the circuits can be miniaturized in a semiconductor substrate in a known manner in an integrated circuit to reduce the size and the cost of manufacturing the circuits.

Figure 7A:
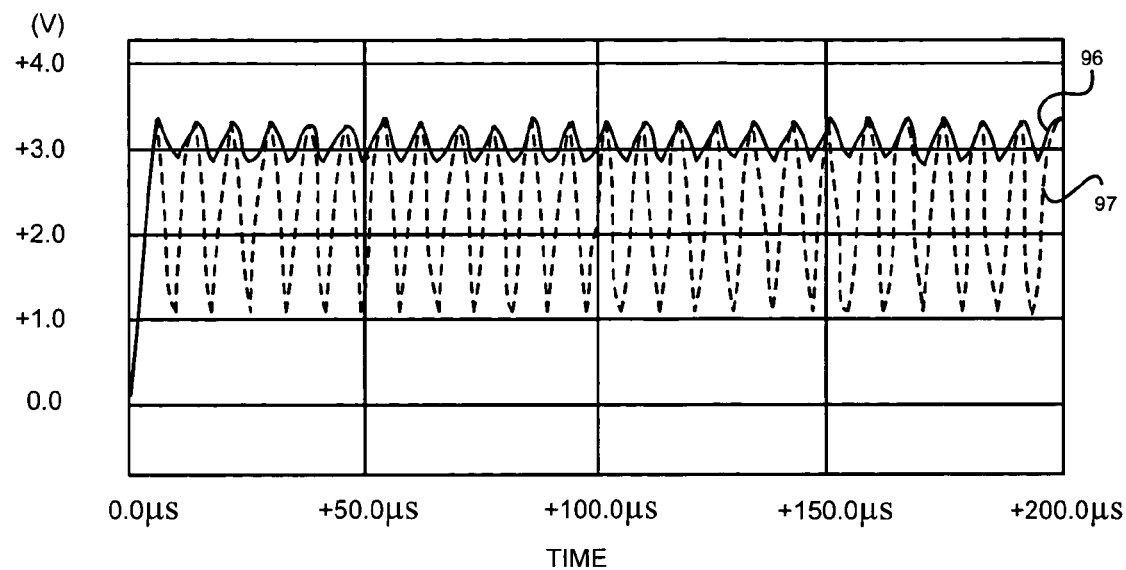
FIG. 7A compares the waveforms of the AC reference signal with the unloaded electric field signal of an electrode when no object is in close proximity to a keypad.

FIG. 7A compares the waveform of the AC signal from the oscillator circuit with the electric field signal of an electrode with no object (e.g., finger) in close proximity. In this unloaded state, the electric field voltage is not attenuated and the voltage at the first node 71 and the second node 73 (FIG. 2) are substantially identical and can be represented by waveform 97 (dashed line). The DC output 82 from the detector D1 is represented by the waveform 96 (solid line). The small peak-to-peak ripple is due to the sample and hold charge capacitor C5 in the circuit that reduces noise and ripple.

Figure 7B:
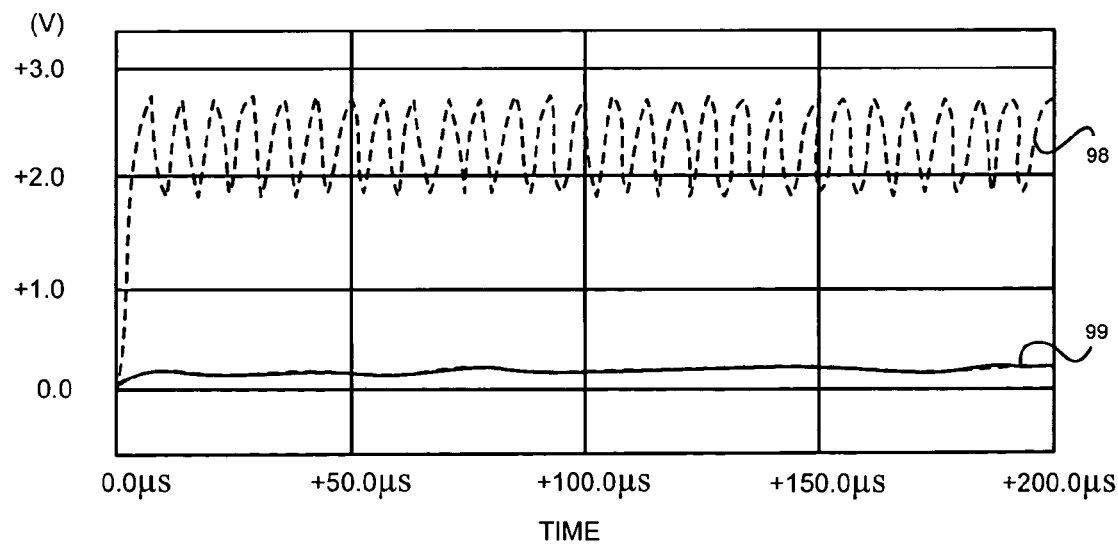
FIG. 7B compares the waveforms of the AC reference signal with the loaded electric field signal of an electrode when an object is in close proximity to a keypad.

FIG. 7B compares the waveform of the AC signal at node 71 versus the electric field signal of an electrode when the object is in close proximity to the electrode 14 (FIG. 1). In this loaded state, the electric field voltage at the second node 73 is attenuated as depicted by the waveform 99 (solid line), and the AC signal at the first node 71 is also affected as represented by the waveform 98 (dash line). The DC output 82 follows waveform 99 due to the attenuation and the change in DC output 82 is analyzed in the controller 84 shown in FIG. 6 and identifies the change as an object touching or in close proximity to the electrode 14.

What is claimed:

1. An electric field proximity keyboard on a substrate, comprising:
    a plurality of keypads each having an electrode radiating an electric field;
    a circuit including as follows:
        a high impedance circuit having a first node and a second node;
        an AC signal source coupled to the first node;
        an analog multiplexer having an output coupled to the second node, and having a plurality of inputs wherein each input is coupled to one electrode;
        a detector circuit generating a DC output based on the voltage difference across the first node and the second node; and
    a controller coupled to the DC output and the analog multiplexer wherein the controller issues control commands to the analog multiplexer to selectively couple each electrode to the second node for a predetermined time period and to determine whether the DC output indicates a disturbance in the electric field from an object in close proximity or touching the keypad and wherein the object in close proximity or touching each keypad disturbs the electric field attenuating the voltage at the second node and the voltage difference between the first and second nodes indicates the distance of the object to each keypad.

2. The keyboard of claim 1, wherein the plurality of keypads are arranged in a m×n array with m rows and n columns, wherein each keypad includes an electrode pair including a row electrode coupled to a row address and a column electrode coupled to a column address, wherein the quantity of keypads is increased by m×n while the I/O addresses are determined by m+n.

3. The keyboard of claim 2, wherein the circuit is integrated with the controller in a semiconductor IC.

4. The keyboard of claim 1, wherein each keypad includes a plurality of electrode pairs arranged in a m×n array, wherein, m rows and n columns of the electrode pairs are associated with each keypad, wherein each electrode pair includes a row electrode coupled to a row address and a column electrode coupled to a column address, wherein the sensitivity and resolution of each keypad is increased by m×n times.

5. The keyboard of claim 4, wherein the circuit is integrated with the controller in a semiconductor IC.

6. The keyboard of claim 1, wherein the circuit is integrated with the controller in a semiconductor IC.

7. The keyboard of claim 1, wherein the controller is programmed to store, adjust and compensate for the shape, size, conductivity, proximity of the object with respect to the plurality of electrodes and environmental conditions.

8. The keyboard of claim 7 wherein the circuit is integrated with the controller in a semiconductor IC.

9. An electric field proximity keyboard on a substrate, comprising:
    a keypad having an electrode radiating an electric field;
    a circuit including as follows:
        a high impedance circuit having a first node and a second node;
        an AC signal source, wherein the AC signal source is coupled to the first node and the electrode is coupled to the second node;
        a detector circuit generating a DC output based on the voltage difference across the first node and the second node; and
    a controller coupled to the DC output wherein the controller determines whether the DC output indicates a disturbance in the electric field from an object in close proximity or touching the keypad and wherein the object in close proximity or touching the keypad disturbs the electric field attenuating the voltage at the second node and the voltage difference between the first and second nodes indicates the distance of the object to the keypad.

10. The keyboard of claim 9, wherein one or more of the AC signal source, high impedance circuit, and the detector circuit are integrated with the controller on a single semiconductor.

11. The keyboard of claim 9, wherein the controller is programmed to store, adjust and compensate for the shape, size, conductivity, proximity of the object with respect to the electrode and environmental conditions.

12. An electric field proximity keyboard on a substrate, comprising:
    a plurality of keypads each having as follows:
        an electrode radiating an electric field;
        a circuit including as follows:

a high impedance circuit having a first node and a second node;

an AC signal source coupled to the first node;

a detector circuit generating a DC output based on the voltage difference across the first node and the second node;

an analog multiplexer having an output coupled to the second node, and having a plurality of inputs wherein each input is coupled to one electrode; and a controller coupled to the DC output and the analog multiplexer, wherein the controller issues control commands to the analog multiplexer to selectively couple the electrode to the second node for a predetermined time period and to determine whether the DC output indicates a disturbance in the electric field from an object in close proximity or touching the keypad, wherein the plurality of keypads is arranged in a m×n array with m rows and n columns, wherein each keypad include an electrode pair including a row electrode coupled to a row address and a column electrode coupled to a column address, wherein the quantity of keypads is increased by m×n while the I/O addresses are determined by m+n.

13. The keyboard of claim 12, wherein each keypad includes a plurality of electrode pairs arranged in a m×n array, wherein each electrode pair includes a row electrode coupled to a row address and a column electrode coupled to a column address, wherein the sensitivity and resolution of each keypad is increased by m×n times.

14. The keyboard of claim 13, wherein the controller is programmed to store, adjust and compensate for the shape, size, conductivity, proximity of the object with respect to the plurality of electrodes pairs and environmental conditions.

15. The keyboard of claim 14, wherein the circuit is integrated with the controller in a semiconductor IC.

16. The keyboard of claim 13, wherein the circuit is integrated with the controller in a semiconductor IC.

17. The keyboard of claim 12, wherein the controller is programmed to store, adjust and compensate for the shape, size, conductivity, proximity of the object with respect to the electrode pairs and environmental conditions.

18. The keyboard of claim 17, wherein the circuit is integrated with the controller in a semiconductor IC.

19. The keyboard of claim 12, wherein the circuit is integrated with the controller in a semiconductor IC.

* * * * *